United States Patent [19]
Dharmarajan et al.

[11] Patent Number: 5,304,871
[45] Date of Patent: Apr. 19, 1994

[54] PROGRAMMABLE INTERCONNECT ARCHITECTURE EMPLOYING LEAKY PROGRAMMABLE ELEMENTS

[75] Inventors: Kuthanur R. Dharmarajan, Sunnyvale; Khaled A. El-Ayat, Cupertino; Gregory W. Bakker, Sunnyvale, all of Calif.

[73] Assignee: Actel Corporation, Sunnyvale, Calif.

[21] Appl. No.: 919,605

[22] Filed: Jul. 24, 1992

[51] Int. Cl.$^5$ .......................................... H03K 19/177
[52] U.S. Cl. .................................... 307/465; 307/443
[58] Field of Search ...................... 307/443, 465, 202.1, 307/465.1, 296.1

[56] References Cited

U.S. PATENT DOCUMENTS

| | | | |
|---|---|---|---|
| 4,706,216 | 11/1987 | Carter | 307/465.1 X |
| 4,758,745 | 7/1988 | El Gamal et al. | 307/465 |
| 5,132,571 | 7/1992 | McCollum et al. | 307/465.1 |
| 5,144,166 | 9/1992 | Camarota et al. | 307/465.1 |
| 5,172,014 | 12/1992 | El-Ayat et al. | 307/465 |
| 5,191,241 | 3/1993 | McCollum et al. | 307/465 |
| 5,194,759 | 3/1993 | El-Ayat et al. | 307/465 X |

Primary Examiner—David R. Hudspeth
Attorney, Agent, or Firm—D'Alessandro, Frazzini & Ritchie

[57] ABSTRACT

Apparatus for terminating unused input lines in a user-programmable interconnect architecture to one of a first voltage potential and a second voltage potential comprises at least one first tie-off conductor divided into at least two first segments and insulated from and intersecting the input lines, and at least one second tie-off conductor divided into at least two second segments and insulated from and intersecting the input lines. A plurality of first termination transistors each have their drains connected to a voltage rail for the first voltage potential and their sources connected to a different one of the first segments. A plurality of second termination transistors each have their sources connected to a voltage rail for the first voltage potential and their drains connected to a different one of the second segments. A termination transistor gate line is connected to the gates of each of the first and second termination transistors. A plurality of programming transistors each has its source connected to a different one of the first and second segments and its drain connected to a circuit which supplies a programming potential. A programming transistor gate line is connected to the gates of each of the programming transistors. Programming circuitry is connected to the programming transistor gate line, and is used to selectively turn on the gates of the programming transistors during a programming operation, and to selectively connect a programming voltage potential to the drain of a selected programming transistor while simultaneously connecting a potential substantially equal to one half of said programming voltage potential to the drains of all other programming transistors. Operation enable circuitry is connected to the first and second termination transistor gate line to connect the first and second segments to the first and second voltage potentials during circuit operation.

4 Claims, 5 Drawing Sheets

PROGRAMMABLE INTERCONNECT ARCHITECTURE EMPLOYING LEAKY PROGRAMMABLE ELEMENTS

BACKGROUND OF THE INVENTION

1. Field of the Invention

The present invention relates to user-programmable interconnect architectures employing antifuse elements. More particularly, the present invention relates to such architectures adapted to permit the use of leaky antifuse elements.

2. The Prior Art

In some user-programmable interconnect architectures incorporating logic function circuits, such as field-programmable gate array (FPGA) circuits, all unrouted inputs to the logic function circuits are tied to either a $V_{CC}$ conductor or a ground conductor during the programming process. In general, existing products, such as those manufactured by Actel Corporation of Sunnyvale, Calif., employ a single continuous $V_{CC}$ or ground tie-off track for every group (called a routing channel) of interconnect conductors. During normal circuit operation, the $V_{CC}$ and ground tie-off tracks are connected to $V_{CC}$ and ground potentials, respectively. These lines in turn pass $V_{CC}$ and ground potentials to the selected inputs through selectively programmed antifuses. These tie-off tracks are also used to tie unused general interconnect conductor segments to a fixed voltage potential, usually ground.

In some prior art FPGA devices, notably the ACT2 and ACT3 families of products manufactured by Actel, the antifuses which are used to tie off unrouted inputs are programmed by taking the horizontal tie-off track ($V_{CC}$/ground) up to the programming voltage ($V_{PP}$) while grounding the vertical track, usually a function circuit input. For a 10K gate die, as many as 800 inputs may be tied to a single VCC or ground track. All other horizontal tracks and module inputs are maintained at a voltage of $V_{PP}/2$ during this programming step so as to prevent inadvertent programming of a wrong antifuse.

This architecture presents several potential problems, especially when "leaky" antifuses, such as antifuses employing amorphous silicon antifuse material layers, are employed in the design. Changes in the antifuse processing method, or normal variances in a single antifuse process, can result in a wide range of leakage currents through the many unprogrammed antifuses, during programming of a single antifuse. If the individual leakage currents are high (e.g. > 10 nA) a significant and undesirable leakage current must be supplied from the $V_{PP}$ programming voltage source, in addition to the expected programming current.

The highest leakage current occurs on a $V_{CC}$/ground tie-off track as the last antifuse on that line is being programmed. Each of the approximately 800 previously programmed input tie-offs crosses approximately 35 horizontal general interconnect tracks, which are biased at a voltage of $V_{PP}/2$. This can result in up to 28,000 antifuses contributing leakage current, which must be supplied from the $V_{PP}$ programming voltage source. Depending on the leakage of a specific antifuse technology, supplying the leakage current from the programming voltage source may be difficult or impossible.

The aforementioned leakage characteristics of the antifuses may also cause an incorrect antifuse to be programmed. Consider a full length horizontal track which is precharges to $V_{PP}/2$ prior to a programming cycle and either left floating or weakly held at $V_{PP}/2$ during the programming cycle. While programming antifuses on the $V_{CC}$/ground track, as many as 800 unprogrammed antifuses will be sourcing leakage current to the horizontal track while only a single antifuse will be sinking current from the track. The horizontal track voltage may rise sufficiently to erroneously program the single antifuse sinking the current.

It is therefore an object of the present invention to provide an antifuse-based interconnect architecture which overcomes the shortcomings of the prior art.

Another object of the invention is to provide a viable interconnect architecture tolerant to programmable elements with poor electrical characteristics.

It is a further object of the invention to provide an interconnect architecture which maximizes correct programming of intended antifuses.

Another object of the invention is to provide an interconnect architecture which allows the use of different types of programmable elements with poor I-V charcteristics and good RC electrical characteristics, and allows use of inferior programmable elements.

Another objective is to provide an interconnect architecture which allows the use of different types of programmable elements which are simpler to fabricate.

BRIEF DESCRIPTION OF THE INVENTION

Apparatus for terminating unused input lines in a user-programmable interconnect architecture to one of a first voltage potential and a second voltage potential comprises at least one first tie-off conductor divided into at least two first segments and insulated from and intersecting the input lines, and at least one second tie-off conductor divided into at least two second segments and insulated from and intersecting the input lines. A plurality of first termination transistors each have their drains connected to a voltage rail for the first voltage potential and their sources connected to a different one of the first segments. A first termination transistor gate line is connected to the gates of each of the first termination transistors. A plurality of second termination transistors each have their sources connected to a voltage rail for the second voltage potential and their drains connected to a different one of the second segments. The termination transistor gate line is connected to the gates of each of the second termination transistors. A plurality of programming transistors each has its source connected to a different one of the first and second segments and its drain connected to a circuit which supplies a programming potential. A programming transistor gate line is connected to the gates of each of the programming transistors. Programming circuitry is connected to the programming transistor gate line, and is used to selectively turn on the gates of the programming transistors during a programming operation, and to selectively connect a programming voltage potential to the drain of a selected programming transistor while simultaneously connecting a potential substantially equal to one half of said programming voltage potential to the drains of all other programming transistors. Operation enable circuitry is connected to the first and second termination transistor gate line to connect the first and second segments to the first and second voltage potentials during circuit operation.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons. The antifuse programming techniques useful with the present invention are known in the art and are disclosed in U.S. Pat. No. 4,758,745 to El Gamal et al., which is expressly incorporated herein by reference.

Antifuse-based user-programmable interconnect architectures have come into wide use in the industry in the last several years. Such architectures employ a network of interconnect conductors which may be connected to one another by programming antifuse elements disposed between the interconnect conductors. Some of these interconnect conductors may run the full width of the array.

In any practical integrated circuit employing such a user-programmable interconnect architecture, there may be anywhere from about 100,000 to over 800,000 antifuse elements embedded in the interconnect structure. Prior to use of the integrated circuit, desired ones of the antifuses are programmed to form a custom interconnect pattern within the integrated circuit. Typical programming procedures comprise placing a programming voltage potential $V_{PP}$ on one interconnect conductor directly connected to the antifuse to be programmed, and placing a ground potential on the other interconnect conductor directly connected to the antifuse to be programmed. All other conductors are charged to an intermediate voltage, such as $V_{PP}/2$, to protect the antifuses connected to them from undue stress which might inadvertently program them or cause later reliability problems.

Figure 1:
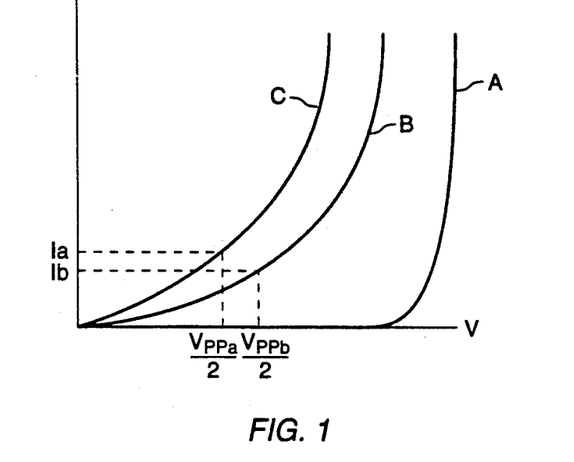
FIG. 1 is a graph showing the leakage characteristics of various types of antifuse elements.

Some species of antifuses, such as those employing oxide-nitride-oxide (ONO) dielectric antifuse materials, exhibit relatively low leakage currents in their unprogrammed state until just before the dielectric material ruptures during the programming process. This is illustrated in curve A of FIG. 1, a graph of antifuse current vs. applied voltage. As may be seen from curve A, the ONO antifuse element has virtually no leakage until the element ruptures. This is great for programming since there are no other extraneous/background currents flowing in the circuit.

Antifuse elements which employ other types of antifuse materials exhibit different leakage characteristics. For example, curves B and C of FIG. 1, and the area therebetween represent the leakage characteristics of the family of antifuses employing amorphous silicon antifuse materials. Comparison of curves A, B, and C shows that the leakage currents exhibited by the amorphous silicon antifuses of curves B and C are substantially higher at significantly lower voltages than the leakage exhibited by the ONO antifuses of curve A. At $V_{PP}/2$, the leakage current from curves B and C are Ia and Ib respectively. Ia and Ib may typically be between about 1-100 nA. The magnitude of these currents present significant problems for the programming and test of interconnect architectures using these antifuses. This problem is mainly due to the fact that there is such a large number of these elements that are leaking this current at any time.

These differences in antifuse characteristics can have a major impact on the design of user-programmable interconnect architectures employing antifuse elements. The types of antifuses exhibiting leakage behavior such as illustrated in curves B and C of FIG. 1 cannot be merely substituted into architectures which have employed ONO type antifuses.

Four main problems are presented by architectures employing programmable elements with poor leakage characteristics. First, voltage drops in the programming path due to leakage may prevent element programming. Second, excessive leakage-sustaining currents may be required from periphery circuits to maintain correct programming voltages. Third, voltages on floating tracks drifting to unsafe voltages may result in incorrect programming. Finally, when attempting to tie off unused general interconnect conductors, one or more undesired programming paths may exist in parallel with a desired programming path.

Figure 2A:
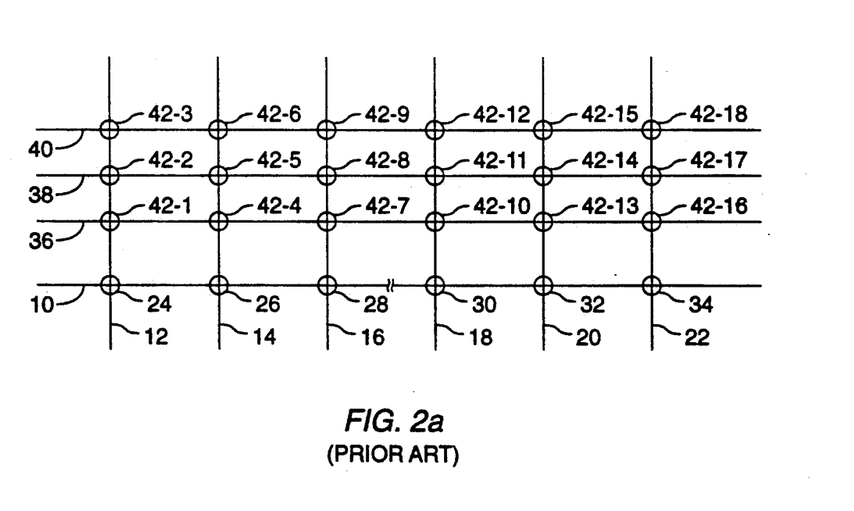
FIG. 2a is a schematic diagram of a portion of a prior art architecture.
Figure 2B:
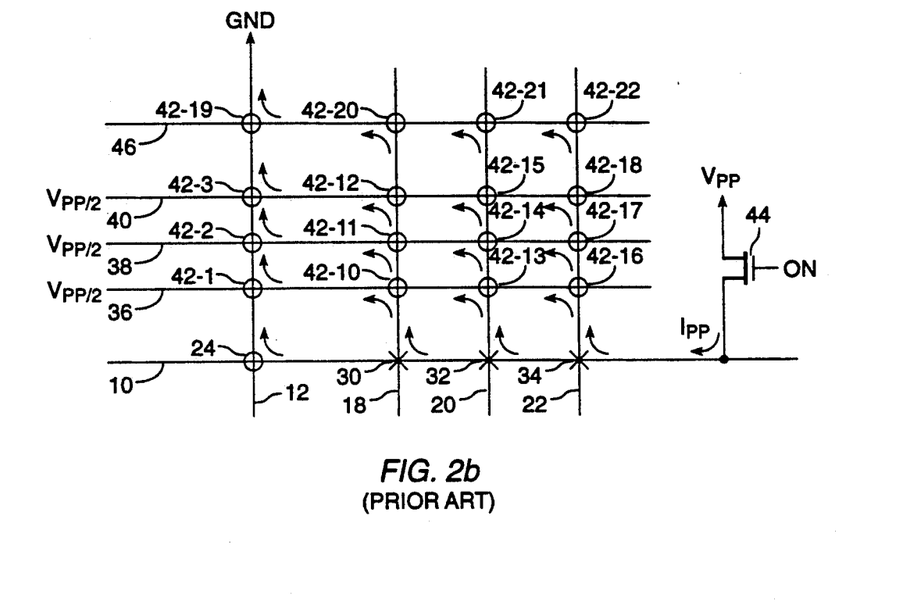
FIG. 2b is a schematic diagram of a portion of the prior art architecture of FIG. 2a illustrating the existence of leakage currents during antifuse programming and the problems caused thereby.
Figure 2C:
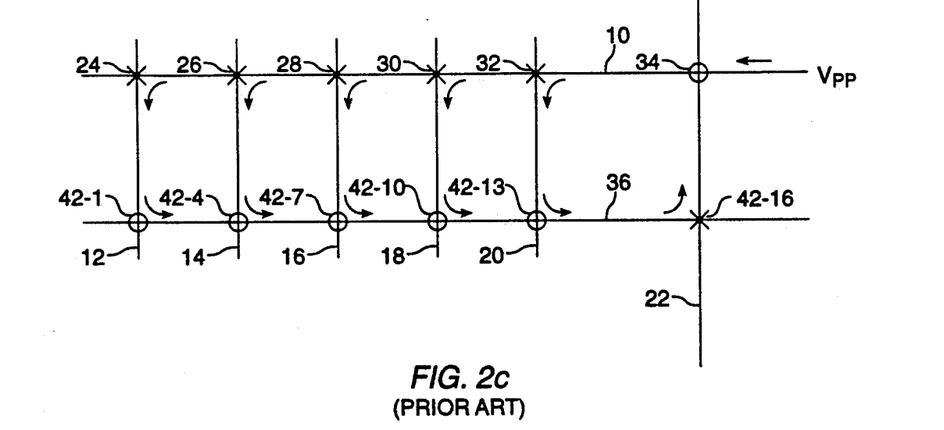
FIG. 2c is a schematic diagram of a portion of the prior art architecture of FIG. 2a illustrating the existence of ambiguity programming paths during antifuse programming and the problems caused thereby.

The problems encountered by designers when attempting to substitute antifuses having higher leakage for ONO antifuses are illustrated with respect to FIGS. 2a-2c, schematic diagrams of a portion of a typical antifuse-based interconnect architecture. FIG. 2a is a general schematic diagram of a portion of such an architecture, and FIGS. 2b and 2c are redrawn to emphasize certain features of the architecture for the purpose of illustrating some of the problems encountered therewith.

In such architectures, it is typical for hundreds or thousands of interconnect conductors (usually inputs of logic function circuits) to intersect special purpose tracks used to tie off inputs which are to remain unused in the user-implemented circuit or which are to be used to implement a desired logic function. Some of these tracks will be tied off to ground potential and some of these tracks will be tied off to $V_{CC}$ potential. Typically, antifuses are programmed to connect the desired inputs to the tracks, and then an antifuse at either end of each tie-off track is programmed, or a transistor is turned on, to connect the tie-off track appropriately to $V_{CC}$ or ground.

Changes in the antifuse fabrication process, or normal variances in a single antifuse process, can result in a wide range of leakage currents through the unprogrammed antifuse, when $V_{PP}/2$ is applied across the antifuse during programming. If the leakage is high (e.g. >10 nA) a significant and undesirable leakage current must be supplied from the $V_{PP}$ programming path, in addition to the expected programming current. The highest leakage current occurs on a tie-off track as the last fuse on that track is being programmed.

FIG. 2a shows a typical one of these tie-off tracks at reference numeral 10. A plurality of logic function circuit inputs assigned reference numerals 12, 14, 16, 18, 20, and 22 are connectable to tie-off track 10 through antifuse elements 24, 26, 28, 30, 32, and 34, respectively.

Following the earlier-stated assumption, each of the approximately 800 previously-programmed logic function circuit inputs crosses approximately 35 horizontal general interconnect conductor segments, which are biased at a voltage of $V_{PP}/2$. This results in 28,000 fuses contributing leakage current, supplied from the $V_{PP}$ programming path. Depending on the leakage of a specific antifuse technology, supplying the leakage current through the programming path may be difficult or impossible. From an examination of the curves B and C of FIG. 1, those of ordinary skill in the art will recognize that architectures employing amorphous silicon antifuses are especially susceptible to this problem.

Three illustrative general interconnect conductor segments are shown at reference numerals 36, 38, and 40. As shown in FIG. 2a, antifuses 42-1, 42-2, and 42-3 connect general interconnect conductor segments 36, 38, and 40, respectively, to input line 12. If general interconnect conductor segments 36, 38, and 40 are biased at a voltage of $V_{PP}/2$, components of leakage current will flow from tie-off track 10 (held at $V_{PP}$) through antifuses 26, 28, 30, 32, and 34, to tracks 14, 16, 18, 20, and 22, and then to tracks 36, 38, and 40 through antifuses 42-4 through 42-18, and then to input line 12 through antifuses 42-1, 42-2, and 42-3. To illustrate the worst-case condition, if antifuses 26, 28, 30, 32 and 34 have all been programmed to tie off inputs 14, 16, 18, 20, and 22 to tie-off track 10, the sum of all individual leakage currents is maximized. If the leakage current is high enough, it may draw so much current from the $V_{PP}$ supply the voltage source for $V_{PP}$ is loaded too heavily, resulting in a degradation of $V_{PP}$ below the value necessary to guarantee programming.

Excessive current leakage through unprogrammed antifuses may also cause an incorrect antifuse to be programmed. Consider the case where antifuse 24 is to be programmed to connect input 12 to tie-off track 10. General interconnect conductor segment 36 is precharged to $V_{PP}/2$ prior to a programming cycle and either left floating or weakly held at $V_{PP}/2$ during the programming cycle. While programming antifuse 24 on the $V_{CC}$/ground tie-off track 10, as many as 800 unprogrammed antifuses will be sourcing leakage current from the tie-off track 10. The resulting total leakage current flowing into general interconnect conductor segment 36 may cause its voltage to rise sufficiently to program the single antifuse 42-1 which is sinking current, resulting in a programming error.

FIG. 2b is a schematic diagram comprising a portion of the architecture depicted in FIG. 2a. FIG. 2b illustrates the additive effects of the leakage currents in the situation just described, and their potential consequences. Programming voltage $V_{PP}$ is supplied to tie-off track 10 through transistor 44 in a known manner. Similarly, ground potential is supplied to input 12 in a known manner. If it is assumed that antifuses 30, 32, and 34, connecting inputs 18, 20, and 22, respectively, to tie-off track 10, have already been programmed, leakage paths through unprogrammed antifuses 42-10, 42-13, and 42-16 exist to general interconnect conductor 36, which is shown to be held at intermediate voltage $V_{PP}/2$ by an active circuit. These leakage paths cause more current consumption by the active circuit in its attempt to maintain conductor 36 at $V_{PP}/2$. Similar situations exist for conductors 38 and 40 because of current leakage through unprogrammed antifuses 42-11, 42-14, and 42-17, and 42-12, 42-15, and 42-18, respectively. In addition, leakage paths to ground from input 12 exist through unprogrammed antifuses 42-1, 42-2, and 42-3. These paths are shown by the small arrows in FIG. 2b.

A related problem occurs if an interconnect conductor is charged to the potential $V_{PP}/2$ and left floating at that voltage during programming, as is done during some programming procedures. The voltage is maintained by the capacitance of the interconnect conductor. Conductor 46 is shown connected to inputs 18, 20, and 22 through unprogrammed antifuses 42-20, 42-21, and 42-22. Leakage currents through unprogrammed antifuses 42-20, 42-21, and 42-22, shown by small arrows, can charge the capacitance of interconnect conductor 46 enough to raise its voltage to a dangerous level, risking erroneous programming of antifuse 42-19, connected between interconnect conductor 46 and ground.

FIG. 2c is a schematic diagram comprising a portion of the architecture depicted in FIG. 2a. FIG. 2c illustrates the problem of ambiguity in antifuse programming due to the presence of parasitic parallel programming paths. Assume antifuses 24, 26, 28, 30, and 32 have been programmed to tie off inputs 12, 14, 16, 18, and 20 to tie-off track 10. In addition, assume that general interconnect conductor segment 36 is to be unused and it is desired to tie it off also. Antifuse 42-16 has been programmed to connect general interconnect conductor segment 36 to input 22, and it is desired to complete the tie off by programming antifuse 34 to connect input 22 to tie-off track 10. The $V_{PP}$ potential is therefore placed on tie-off track 10 and ground potential is placed on input 22 to program antifuse 34. Those of ordinary skill in the art will observe that, due to the fact that antifuse 42-16 has been programmed, ground potential is placed on general interconnect conductor segment 36 and that the programming potential is thus placed acros antifuses 42-1, 42-4, 42-7, 42-10, and 42-13, a situation in which it cannot be predicted which of antifuses 34 42-1, 42-4, 42-7, 42-10, and 42-13 will be programmed. Alternately, the total leakage to ground from $V_{PP}$ through tie-off track 10, and the five parallel paths comprising already-programmed antifuses 24, 26, 28, 30, and 32, inputs 12, 14, 16, 18, and 20, unprogrammed but leaky antifuses 42-1, 42-4, 42-7, 42-10, and 42-13 (shown as small arrows in FIG. 2c) may load down the $V_{PP}$ line so much that it is at a voltage too low to reliably program an antifuse.

According to a first aspect of the present invention, the problems depicted in FIGS. 2a and 2b encountered in the employment of leaky antifuse devices in user-programmable interconnect architectures may be reduced or eliminated by providing $V_{CC}$/ground tie-off tracks which are broken into many short segments. During programming only the individual short $V_{CC}$/ground tie-off segment connected to the antifuse to be programmed is raised to $V_{PP}$ along with its previously-programmed logic function circuit inputs. The leakage described above is reduced by the ratio of the number of inputs tied to the specific $V_{CC}$/ground tie-off track segment to the total number of inputs tied to an otherwise unsegmented $V_{CC}$/ground tie-off track. In addition, the likelihood of programming an undesired antifuse as described above is reduced since the ratio of leakage sources to leakage sinks is greatly reduced. The floating track voltage will drift less and will drift more slowly in architectures configured according to the present invention.

According to the present invention, the segmented $V_{CC}$/ground tie-off tracks can be added to existing architectures by providing programming transistors, segment transistors for each segment, and termination transistors, and adding a single termination control line for the segmented $V_{CC}$/ground tie-off tracks in each channel. These devices allow programming, testing, and operating mode tieoff respectively. The additional termination control line allows segmenting the $V_{CC}$/ground tie-off track without adversely affecting the segmentation and routability of the routed general wiring tracks.

According to a second aspect of the present invention, a dedicated tie-off line is provided for terminating the general interconnect conductors in the architecture. This dedicated tie-off line is separate from the segmented tie-off lines used to terminate the inputs of the logic function circuits, and thus prevents the programming ambiguity depicted in FIG. 2c.

Figure 3:
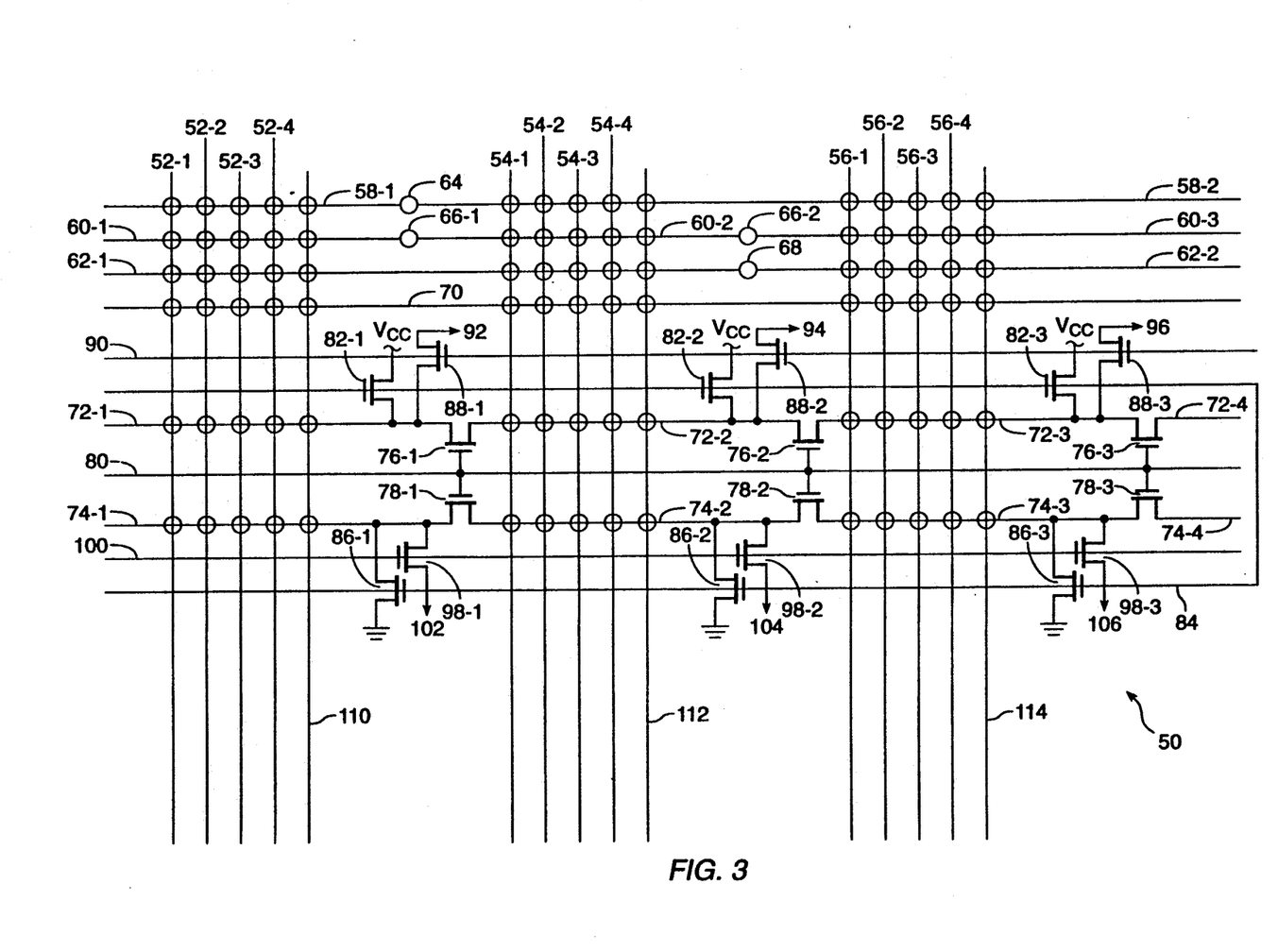
FIG. 3 is a schematic diagram of an illustrative portion of the interconnect architecture according to a first presently preferred embodiment of the present invention.

Referring now to FIG. 3, a portion of an apparatus 50 for tying off unused input lines in a user-programmable interconnect architecture to one of a first voltage potential and a second voltage potential is illustrated in schematic diagram form. Those of ordinary skill in the art will recognize that FIG. 3 shows only an illustrative portion of a user-programmable interconnect array and that the present invention may be implemented in architecture of arbitrary size.

FIG. 3 illustrates three groups of vertical conductors 52-1, 52-2, 52-3, and 52-4, 54-1, 54-2, 54-3, and 54-4, and 56-1, 56-2, 56-3, and 56-4 which are input lines to logic function circuits (not shown). These input lines are shown intersecting four general interconnect conductors. Three general interconnect conductors are shown divided into segments 58-1 and 58-2, 60-1, 60-2, and 60-3, and 62-1 and 62-2 by antifuses 64, 66-1 and 66-2, and 68. The fourth general interconnect conductor 70 is shown unsegmented. The segmentation of interconnect conductors is known in the art as exemplified by U.S. Pat. No. 5,073,729.

FIG. 3 illustrates a first tie-off line used to terminate unused inputs to VCC and a second tie off line used to terminate unused inputs to ground. Thus a VCC tie-off line is shown as segments 72-1, 72-2, 72-3, and 72-4 and ground tie-off line is shown as segments 74-1, 74-2, 74-3, and 74-4. $V_{CC}$ tie-off line segments 72-1, 72-2, 72-3, and 72-4 are separated from each other and other $V_{CC}$ tie-off line segments by segment transistors 76-1, 76-2, and 76-3, and ground tie-off line segments 74-1, 74-2, 74-3, and 74-4 are separated from each other and other ground tie-off line segments by segment transistors 78-1, 78-2, and 78-3.

The gates of segment transistors 76-1, 76-2, and 76-3 and 78-1, 78-2, and 78-3 are tied together to segment-gate line 80. Segment-gate line 80 may be activated to turn on the segment transistors to test their continuity, etc., such as in the manner disclosed in U.S. Pat. No. 5,083,083.

Tie-off line segments 72-1 and 74-1 are intersected by input lines 52-1 through 52-4. Tie-off line segments 72-2 and 74-2 are intersected by input lines 54-1 through 54-4. Tie-off line segments 72-3 and 74-3 are intersected by input lines 56-1 through 56-4. Programmable interconnect elements, shown as un-numbered circles at the intersections of the tie-off line segments and the inputs, may be selectively programmed to connect the input lines to either of the two tie-off segments which they intersect.

Termination transistors are used to connect the tie-off line segments to selected voltages, usually either $V_{CC}$ or ground. In the embodiment disclosed in FIG. 3, tie off segments 72-1 through 72-4 are used to tie inputs off to $V_{CC}$ and tie-off line segments 74-1 through 74-4 are used to tie inputs off to ground. Termination transistors 82-1, 82-2, and 82-3 are N-Channel MOS transistors having their sources connected to tie-off segments 72-1, 72-2, and 72-3, respectively. The drains of termination transistors 82-1, 82-2, and 82-3 are connected to $V_{CC}$. The gates of termination transistors 82-1, 82-2, and 82-3 are connected to a termination transistor gate line 84.

Termination transistors 86-1, 86-2, and 86-3 are N-Channel MOS transistors having their sources connected to tie-off line segments 74-1, 74-2, and 74-3. The drains of termination transistors 86-1, 86-2, and 86-3 are connected to ground. The gates of termination transistors 86-1, 86-2, and 86-3 are connected to termination transistor gate line 84.

Programming transistors 88-1, 88-2, and 88-3 are M-Channel MOS transistors and have their sources connected to tie-off line segments 72-1, 72-2, and 72-3, respectively. The gates of programming transistors 88-1, 88-2, and 88-3 are connected to a programming gate line 90. The drains of programming transistors 88-1, 82-2, and 88-3 are connected to programming potential supply lines 92, 94, and 96, respectively. Programming transistors 98-1, 98-2, and 98-3 are M-Channel MOS transistors and have their sources connected to tie-off line segments 74-1, 74-2, and 74-3, respectively.

The gates of programming transistors 98-1, 98-2, and 98-3 are connected to a programming gate line 100. The drains of programming transistors 98-1, 98-2, and 98-3 are connected to programming potential supply lines 102, 104, and 106, respectively. Those of ordinary skill in the art will recognize that lines 92, 94, and 96 can be common with lines 102, 104, and 106, respectively.

Programming transistors 88-1, 88-2, and 88-3, and 98-1, 98-2, and 98-3 are used to supply one end of a programming potential to the tie off line segments for programming the user-programmable interconnect elements at the intersections of selected tie-off line segments and selected inputs. The other end of the programming potential is supplied to the selected input line by transistors in a known manner, such as that disclosed in U.S. Pat. No. 4,758,745.

When it is desired to program one of the antifuse interconnect elements to tie off an input line to a tie-off line segment, the programming voltage $V_{PP}$ is applied across it by placing either $V_{PP}$ or ground on the appropriate one of programming gate lines 90 or 100 while applying $V_{PP}/2$ over the other input lines. The selected input line is supplied with either ground or $V_{PP}$ such that the potential $V_{pp}$ is placed across the antifuse to be programmed.

According to a second aspect of the present invention, also illustrated in FIG. 3, at least one dedicated tie-off conductor runs the length of the array in a direction parallel to the input lines and orthogonal to the tie-off segment lines. In actual embodiments of the invention, as many of these dedicated tie-off lines as needed to potentially tie off every general interconnect segment may be used. Dedicated tie-off lines 110, 112, and 114 are used to tie off unused ones of the general interconnect conductor segments 58-1 and 58-2, 60-1, 60-2, and 60-3, and 62-1 and 62-2, and general interconnect conductor 70.

The use of dedicated tie-off lines 110, 112, and 114 avoids the multiple programming path ambiguity problem disclosed with respect to FIG. 2c by avoiding ambiguity paths which could result in ambiguous antifuse programming or programming failure due to excessive loading of the programming voltage source. Those of ordinary skill in the art will recognize that together, the first and second aspects of the present invention provide for all tie-off tracks to be orthogonal to the conductors which will be tied off to them and that the tie-off connection is made through a single antifuse.

Figure 4:
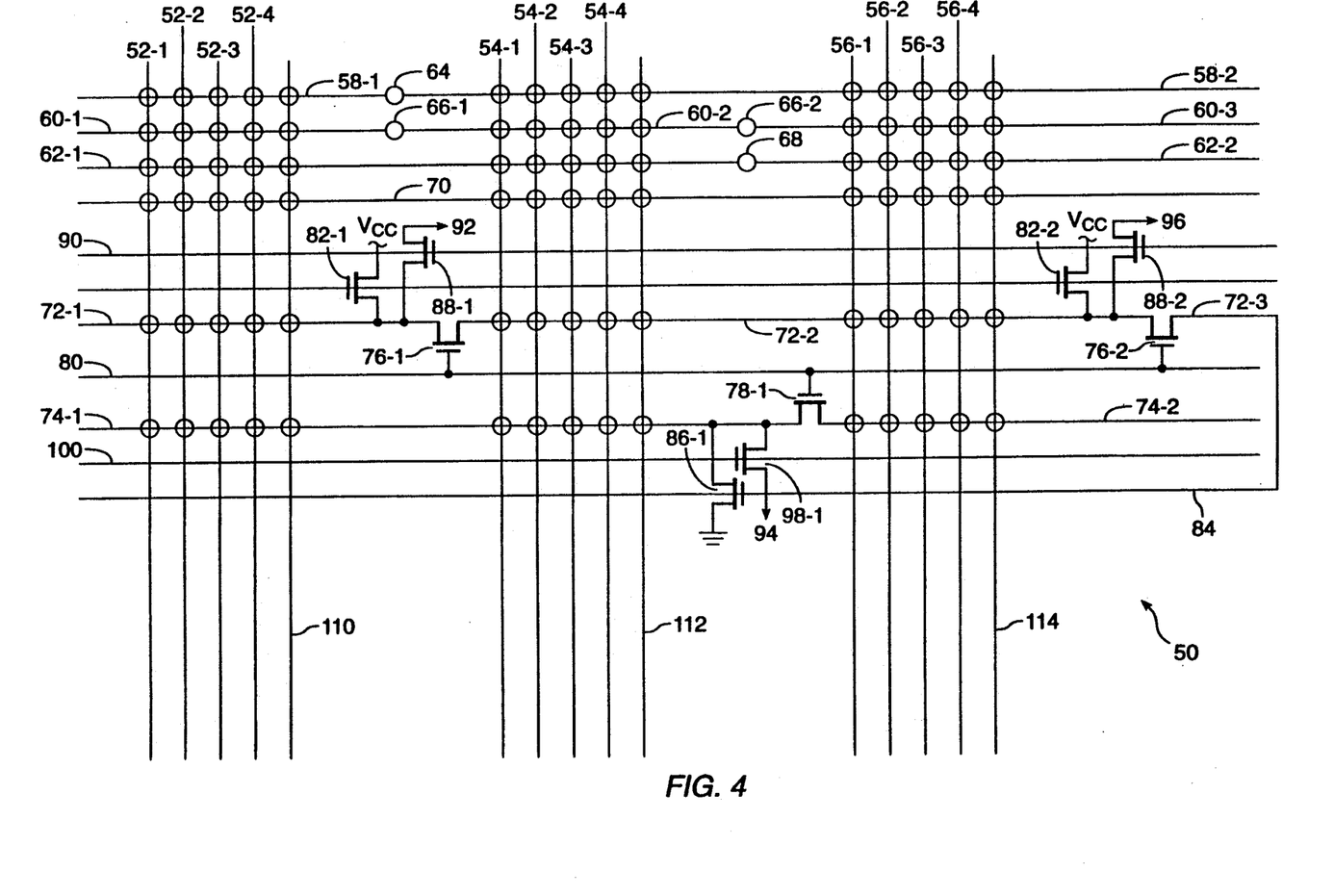
FIG. 4 is a schematic diagram of an illustrative portion of the interconnect architecture according to a second presently preferred embodiment of the present invention.

Referring now to FIG. 4, a variation of the architecture in FIG. 3 is shown. Those of ordinary skill in the art will recognize that the architecture of FIG. 4 is very similar to that of FIG. 3, except that $V_{CC}$ tie-off line segments 72-1 and 72-2 are separated by segment transistor 76-1 and are offset from ground tie-off line segments 74-1 and 74-2, which are separated by segment transistor 78-1. Offsets have been used in general interconnect lines, e.g., in U.S. Pat. No. 4,873,459 to El Gamal et al.

Termination transistors 82-1 and 82-2 are used to connect $V_{CC}$ tie-off line segments 72-1 and 72-2 to the $V_{CC}$ rail and termination transistor 86-1 is used to connect ground tie-off line segment 74-1 to the ground rail. Programming transistors 88-1, 88-2, and 98-1 have their sources connected to tie-off line segments 72-1, 72-2 and 74-1, respectively, and their drains connected to programming potential supply lines 92, 96, and 94, respectively. The operation of the architecture of FIG. 4 is basically the same as that of FIG. 3. The advantage of using the architecture of FIG. 4 is that the architecture of the present invention may thus be more economically implemented using fewer tie-off lines and fewer transistors. In the embodiment of FIG. 4, programming gate lines 90 and 100 may in fact be a common gate line since lines 92, 94, and 96, together with combined gate lines 90 and 100, define a unique segment unlike the embodiment of FIG. 3.

Figure 5:
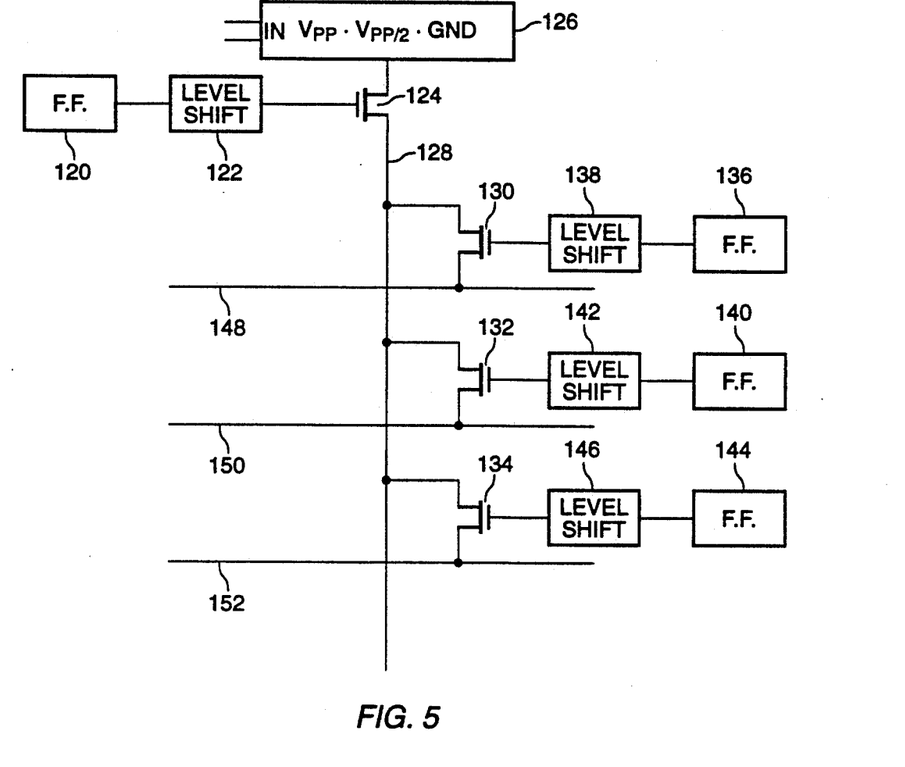
FIG. 5 is a combination schematic/block diagram of a typical programming control circuit for controlling the programming of the interconnect architecture according to a presently preferred embodiment of the present invention.

Referring now to FIG. 5, circuitry is shown for driving the programming potential supply lines to the programming transistors of FIGS. 3 and 4. Flip-flop 120 drives level shifting circuit 122. The output of level shifting circuit 122 is used to drive the gate of N-Channel MOS transistor 124. The drain of N-Channel MOS transistor 124 is connected to a source of programming potential 126 which may supply either $V_{PP}$, $V_{PP}/2$, or ground potential to line 128. Programming potential source 126 which act as decoders and voltage controllers. Depending on the state of its inputs, which may be driven by programming control circuitry such as that disclosed in U.S. Pat. No. 4,758,745, programming potential source 126 is capable of driving line 128 to $V_{PP}$, $V_{PP}/2$ or a tristate, or ground. Those of ordinary skill in the art will readily recognize that programming potential source 126 may be configured using standard transistor switching circuitry.

Line 128 is shown connected to the drains of MOS transistors 130, 132, and 134. The gates of MOS transistors 130, 132, and 134 are driven by flip-flops 136, 140, and 144 and level shifters 138, 142, and 146. Those of ordinary skill in the art will recognize that the level shifters are used to overdrive the gates of the transistors to assure no voltage drops across them to supply the full programming potential to the antifuse nodes to be programmed.

The sources of N-Channel MOS transistors 130, 132, and 134 are connected to programming potential supply lines 148, 150, and 152. These programming potential supply lines line may be the ones referred to by reference numerals 92, 94, and 96, and 102, 104, and 106 in FIGS. 3 and 4.

Flip-flops 120, 136, 140, and 144 are loaded from off chip with data directing the programming as is well known in the art such as through serial shift register chains as taught in U.S. Pat. No. 4,758,745. A logic one will result in the transistor associated with the flip-flop being turned on, thus placing the programming potential on the programming potential supply line, and a logic zero will result in the transistor remaining off.

Figure 6:
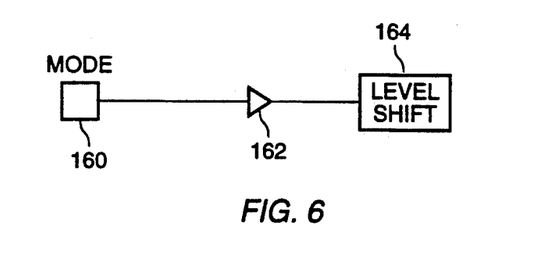
FIG. 6 is a combination schematic/block diagram of a typical circuit for controlling the termination gate lines according to a presently preferred embodiment of the present invention.

Referring now to FIG. 6, the operation of the architecture of the present invention may be controlled by a mode control signal asserted on an I/O pin of the integrated circuit. I/O pin 160 is a mode input pin. It may drive buffer 162 and charge pump 164. The output of charge pump 164 is used to drive termination transistor gate line 84 to connect the segments of first and second tie-off to $V_{CC}$ and ground, respectively, of the embodiments of either FIGS. 3 or 4.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a user-programmable interconnect architecture disposed on an integrated circuit and including an array of functional circuit modules each having at least one input line and at least one output line, a plurality of general interconnect conductors insulated from and intersecting said input lines, and a plurality of normally-open user-programmable interconnect elements selectively connected between said inputs, said outputs, and ones of said interconnect conductors, apparatus for terminating unused ones of said inputs to one of a first voltage potential and a second voltage potential, comprising:

at least one first tie-off conductor insulated from and intersecting said input lines, said first tie-off conductor divided into at least two first segments;

at least one second tie-off conductor insulated from and intersecting said input lines, said second tie-off conductor divided into at least two second segments;

a plurality of first termination transistors, each of said first termination transistors having a gate, a drain, and a source, each one of said first termination transistors having its drain connected to a voltage rail for said first voltage potential and its source connected to a different one of said first segments;

a plurality of second termination transistors, each of said second termination transistors having a gate, a drain, and a source, each one of said first termination transistors having its source connected to a voltage rail for said first voltage potential and its drain connected to a different one of said second segments;

a termination transistor gate line connected to the gates of each of said first and second termination transistors;

a plurality of programming transistors, each of said programming transistors having a gate, a drain, and a source, each one of said programming transistors having its drain connected to a different one of said first and second segments;

a programming transistor gate line connected to the gates of each of said programming transistors;

programming means, connected to said programming transistor gate line, for selectively turning on the gates of said programming transistors during a programming operation, for selectively connecting a programming voltage potential to the drain of a selected one of said programming transistors while simultaneously connecting a potential substantially equal to one half of said programming voltage potential to the drains of all programming transistors except for said selected one;

operation enable means, connected to said termination transistor gate line, for turning on said first and second termination transistors during an operating mode of said integrated circuit.

2. The apparatus of claim 1, further including:

at least one first segment transistor having a gate, a drain, and a source, each said first segment transistor having its drain and source connected, respectively to adjacent ones of said at least two first segments;

at least one second segment transistor having a gate, a drain, and a source, each said second segment transistor having its drain and source connected, respectively, to adjacent ones of said at least two second segments;

a segment transistor gate line connected to the gates of each of said first and second segment transistors;

testing means, connected to said segment transistor gate line, for selectively turning on the gates of said segment transistors during a testing operation.

3. The apparatus of claim 1 further including:

at least one third tie-off conductor insulated from and intersecting at least some of said general interconnect conductors;

a plurality of normally-open user-programmable tie-off interconnect elements, one of said normally-open user-programmable interconnect elements connected between said tie off conductor and a different one of said intersecting general interconnect conductors; and means for selectively applying a programming voltage potential across selected ones of said normally-open user-programmable tie-off interconnect elements.

4. In a user-programmable interconnect architecture disposed on an integrated circuit and including an array of functional circuit modules each having at least one input line and at least one output line, a plurality of general interconnect conductors insulated from and intersecting said input lines, and a plurality of normally-open user-programmable interconnect elements selectively connected between said inputs, said outputs, and ones of said general interconnect conductors, apparatus for terminating unused ones of said general interconnect conductors to one of a first voltage potential and a second voltage potential, comprising:

at least one tie-off conductor insulated from and intersecting at least some of said general interconnect conductors;

a plurality of normally-open user-programmable interconnect elements, one of said normally-open user-programmable interconnect elements connected between said tie off conductor and a different one of said intersecting general interconnect conductors; and means for connecting said at least one tie-off conductor to one of said first and second voltage potentials.

* * * * *

UNITED STATES PATENT AND TRADEMARK OFFICE
CERTIFICATE OF CORRECTION

PATENT NO. : 5,304,871

DATED : April 19, 1994

INVENTOR(S) : Kuthanur R. Dharmarajan, et al.

It is certified that error appears in the above-identified patent and that said Letters Patent is hereby corrected as shown below:

Col. 8, line 44, change "M-Channel" to —N-Channel—.

Signed and Sealed this

Sixteenth Day of August, 1994

*Attest:*

BRUCE LEHMAN

*Attesting Officer*    *Commissioner of Patents and Trademarks*